March 23, 1954 R. C. A. ELAND 2,673,254
LOW-NOISE AMPLIFIER
Filed April 12, 1951
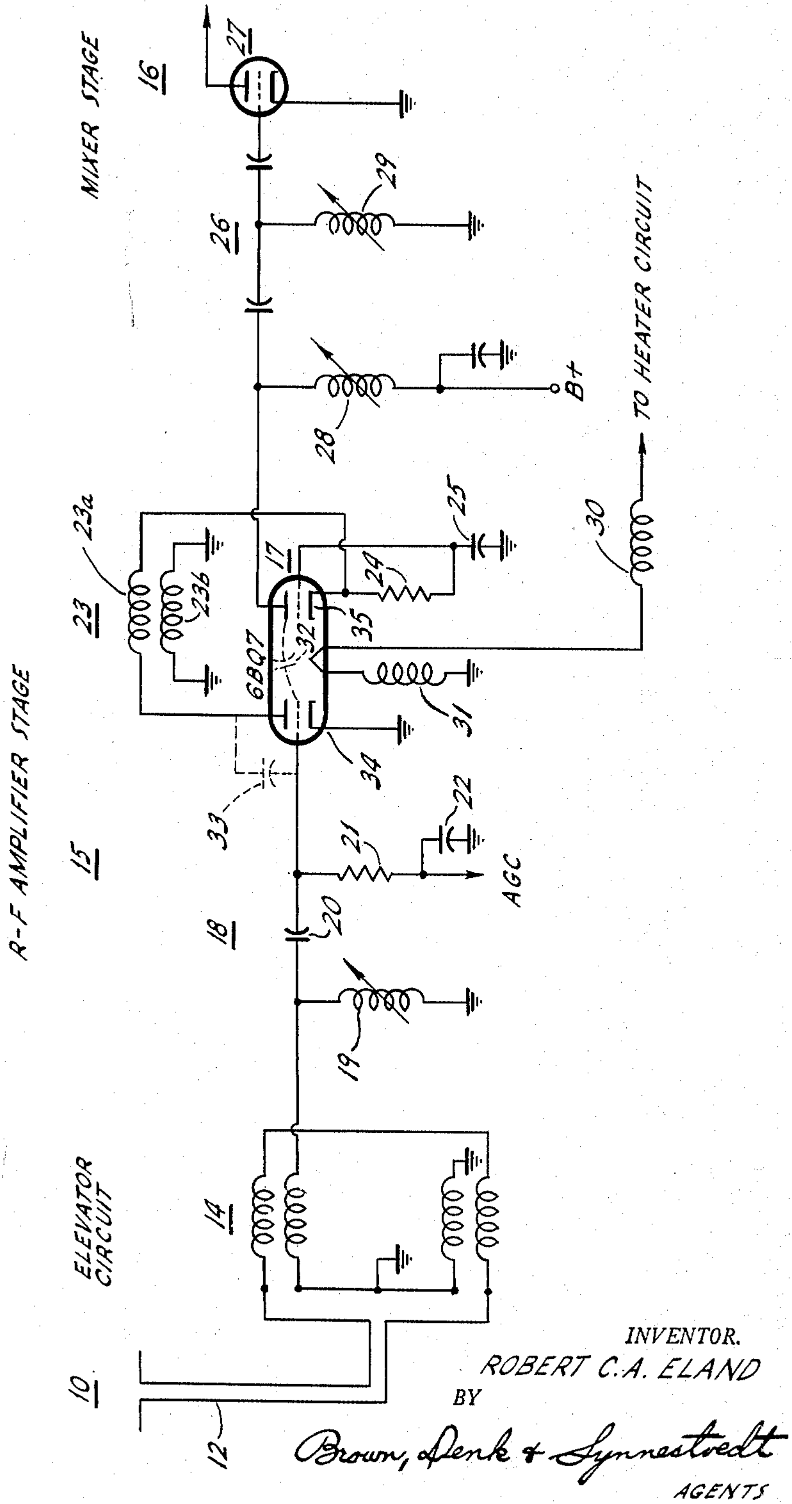
INVENTOR.
ROBERT C.A. ELAND
BY
Brown, Denk & Synnestvedt
AGENTS Patented Mar. 23, 1954

2,673,254

UNITED STATES PATENT OFFICE 2,673,254

LOW-NOISE AMPLIFIER

Robert C. A. Eland, Philadelphia, Pa., assignor to Philco Corporation, Philadelphia, Pa., a corporation of Pennsylvania Application April 12, 1951, Serial No. 220,577

7 Claims. (Cl. 179—171)

The invention herein described and claimed relates to amplifiers, and particularly to so-called "cascode" amplifiers.

The term "cascode amplifier" is used in the art to designate the combination of two triodes connected in cascade the first of which has a grounded cathode and the second of which has a grounded grid. This arrangement has been found to be stable and to have a low noise figure, such being, of course, highly desirable characteristics. As is well known, the noise figure, usually expressed in decibels, indicates the relative amount of noise produced in a particular amplifier and its signal source as compared with the amount of noise which would be produced in a perfect amplifier of the same pass-band which contains no noise except that in the signal source. Stated in other words, the noise figure expresses the relationship between the ideal carrier signal-to-noise power ratio and the measured carrier signal-to-noise power ratio.

The prior art was aware of the fact that the combination of a grounded-cathode triode followed by a grounded-grid triode constitutes a stable low-noise circuit and may be employed to good advantage in the input stage of a radio or television receiver. The prior art also knew that while this type of input circuit is stable even in the absence of neutralization, the employment of neutralization is necessary in order to obtain a lower noise figure.

The object of the present invention is to provide an improved input-stage amplifier whose noise figure is lower than that of prior-art circuits.

Another object of the present invention is to provide an improved form of neutralization for a cascode amplifier, thereby to reduce the noise figure below that of the prior-art circuits.

Another object of the present invention is to provide a grounded-cathode grounded-grid amplifier circuit adapted to provide a low noise figure over a wide range of high frequencies.

Another object of the invention is to provide, in a television receiver adapted to receive signals in two non-contiguous bands of high frequencies, an input-stage amplifier having at the frequencies of the two bands lower noise figures than are provided by prior-art circuits.

In accordance with my invention, the above objects are accomplished by providing, between the output of the first triode and the input of the second triode of a double-triode cascode combination, a phase-delay line effective over a wide range of high operating frequencies to delay the signal by a required amount. At the output end of the phase-delay line, inductance is provided to cancel substantially the stray input capacitance of the second triode, thus to provide a low impedance, primarily resistive, broad band termination. The phase-delay line preferably comprises a transmission line having an effective length equal approximately to one-half wavelength at substantially the center frequency of the operating band, thereby to delay the signal by approximately 180°. Thus, the signal applied to the cathode of the second triode is approximately 180° out of phase with the signal on the plate of the first triode. And, since the signal on the plate of the second triode is in phase with the cathode signal, the signal on the second-triode plate is out of phase with the signal on the plate of the first triode. Hence, if the two triodes be contained in a common envelope, the current fed back to the first-triode grid through the second-triode-plate-to-first-triode-grid interelectrode capacitance tends to neutralize the current flowing through the first-triode-plate-to-first-triode-grid interelectrode capacitance.

In the case of a present-day television receiver which is required to receive signals in a low band and also a high band of frequencies, the transmission-line delay line is preferably given a length equal approximately to one-half wavelength at about the center frequency of the high band, and the inductance, hereinbefore referred to, is given a value substantially to cancel out the input capacitance of the second triode at the high-band frequencies. I have found that with this arrangement, the noise figure is reduced by a significant amount, not only at the high-band frequencies, but also at the low-band frequencies. I am not certain as to the reason for the latter phenomenon, but it may be that at the low-band frequencies, where the input capacitance of the second triode is not fully canceled out by the input inductance and the uncanceled input capacitance increases the effective length of the transmission line, the increase in the effective length of the line is sufficient to make the line substantially equivalent to a one-half wavelength line at the low-band frequencies also. It may also be that, at the low-band frequencies (and also to some extent at the high-band frequencies) reflections occur at the output end of the transmission line which reach the input end of the transmission line out of phase with the original input signal. Such out-of-phase reflections would have a neutralizing effect, at least so it would seem. In any event, while I am not certain as to the correct explanation, I have found repeatedly, and hence am certain, that the arrangement proposed by the present invention provides a marked improvement in the noise figure, which, in the case of a present-day television receiver, is realized on the low-band channels as well as on the high-band channels.

The invention will now be described in more detail with specific reference to the single figure of drawing wherein a preferred form of the invention is shown embodied in the front end of a television receiver.

In the drawing, I have shown an antenna 10, an antenna lead-in 12, and impedance-matching energy-transfer elevator circuit 14, an R.-F. amplifier stage 15, and a mixer stage 16. Antenna 10 is shown to be a simple dipole but may be any suitable type of television antenna. Lead-in 12, in many instances at least, is a 300-ohm balanced twin-lead transmission line, but may be any suitable type of lead-in, as, for example, a 75-ohm unbalanced coaxial line. So far as the present invention is concerned, impedance-matching circuit 14 may be any suitable circuit, but in the drawing is shown to comprise a so-called elevator circuit. If desired, the elevator circuit 14 may be arranged in the manner fully described in my copending application, Serial No. 197,625, filed November 25, 1950.

Radio-frequency amplifier stage 15 may preferably comprise a double-triode 17 having an input circuit 18 of known form comprising variable inductance 19, coupling capacitor 20, grid leak 21, and bypass capacitor 22. The cathode 34 of the first-triode section of double-triode 17 is connected directly to ground, but the cathode 35 of the second-triode section is maintained floating above ground, in well known cascode manner. Resistor 24 is employed to provide grid bias on the second triode, and capacitor 25 is a bypass capacitor whose function is to maintain the grid of the second triode at ground potential with respect to the operating carrier frequencies. The plate circuit of the second triode is shown to include an inductance-tuned double-tuned interstage network 26 coupling the output of the second-triode of double-triode 17 to the input grid of mixer tube 27, but it will be understood, of course, that other interstage networks may be used.

A source of plate voltage, B+, is connected in series with the plates of both triodes; the direct-current path may be traced through inductance 28, the plate resistance of the second triode, transmission-line conductor 23*a*, the plate resistance of the first triode, and thence to ground.

The heater circuit of the double-triode 17 includes an R.-F. choke 30 and an inductance 31. With the exception of inductance 31 whose function will become clear, the circuits and the circuit elements thus far described are conventional.

In accordance with the present invention, a transmission line 23, represented in the drawing by the two windings 23*a* and 23*b*, is connected between the plate of the first triode and the cathode of the second triode of the cascode combination. In the case of a present-day television receiver which is required to receive signals in both a low band of frequencies (54 to 88 megacycles) and a high band of frequencies (174 to 216 megacycles), the transmission line 23 is preferably given a length equal to one-half wavelength at about the center frequency of the high band, and is of such physical form as to have a characteristic impedance approximately equal to the impedance seen when looking into the cathode of the second triode. The inductance 31 provided, in accordance with the present invention, in the heater circuit, is given such value as substantially to resonate, at the high-band frequencies, with the input capacitance of the second triode, comprising the distributed heater-to-ground, heater-to-cathode, and cathode-to-ground capacitances, thus to present a low resistive impedance, at the high-band frequencies, across the output terminals to transmission line 23.

In a typical case, the transconductance of the second triode may be of the order of 6000 microohms and the input impedance seen from the output end of transmission line 23 may be of the order of 150 ohms. In such case, a 150-ohm transmission line is employed having a conductor length of about 30 inches. (A 30-inch transmission line is equivalent to about one-half wavelength at channel 10 of the high band.) To save space, the transmission line 23 preferably may be wound spirally on a coil form having, for example, a diameter of about one-quarter of an inch and a length of about one and one-half inches.

It will be seen that, when the half-wave transmission line described above is used, the signal applied to the cathode of the second triode is approximately 180° out-of-phase with the signal on the plate of the first triode, at least so far as the high-band frequencies are concerned. However, when this arrangement is used, I obtain a marked improvement in noise figure at the low-band frequencies as well as at the high-band frequencies. It appears, therefore, that a substantially similar out-of-phase relationship may exist at the low-band frequencies. At the low-band frequencies, the inductance 31 is insufficient to resonate out the input capacitance of the second triode, and it is clear, therefore, that at these frequencies transmission line 23 is effectively increased in length, at least to some extent. As previously indicated, while I am not certain as to the reason for the marked improvement obtained in the noise figure at the low-band frequencies as well as the high-band frequencies, the explanation may be that the transmission line 23 functions as a one-half wavelength line at the low-band frequencies as well as at the high-band frequencies.

Assuming the foregoing to be the case, then since the signal on the plate of the second triode is in phase with the cathode signal, the signals on the plates of the two triodes of double-triode 17 would be approximately 180° out-of-phase with respect to each other at the frequencies of both the low and the high bands. Thus, current fed back to the grid of the first triode through the second-triode-plate-to-first-triode-grid interelectrode capacitance, indicated in the drawing by capacitance 32, would be in phase-opposition to that fed back to the first-triode grid through the first-triode-plate-to-first-triode-grid interelectrode capacitance 33. Hence, by selecting a double-triode tube having the proper parameters, the current fed back through the interelectrode capacitance 32 would be of the right order of magnitude to effect substantial neutralization of the current flowing to the grid through the interelectrode capacitance 33.

The interelectrode capacitance 32 between the plate of the second triode and the grid of the first triode is, ordinarily at least, much smaller than the interelectrode capacitance 33 between the plate and grid of the first triode. For example, in a typical case, the capacitance 32 may be one-tenth or one-twentieth of a micromicrofarad while the plate-to-grid capacitance 33 of the first triode may be ten or twenty times as large, i. e., of the order of one micromicrofarad. It will be seen, then, that if the amplification factor of the second triode be ten or twenty, the signal voltage on the plate of the second triode will be ten or twenty times as large as the signal on the plate of the first triode, and substantial neutralization will be effected. Some neutralizing current is also probably fed back through the interelectrode capacitance between the second-triode cathode and the first-triode grid but the amount is relatively small since the signal voltage on the second-triode cathode is small relative to that on the plate.

As previously indicated, a neutralizing effect may also be obtained, particularly at the low-band frequencies, from reflections occurring at the cathode end of transmission line 23, since such reflected signals are sent back to the grid of the first triode. But, whatever the true explanation may be, I have found that by employing the arrangement proposed by the present invention, the noise factor is reduced by a significant amount at both the low-band and high-band television frequencies. By way of illustration, I found that when the circuit proposed by the present invention was used in an otherwise conventional type of television receiver employing a 6BQ7 double-triode, a noise figure of about 7 to 8 decibels was obtained throughout the high-band frequencies. This compares with a noise figure of about 9 to 11 decibels obtained at the high-band frequencies with the prior-art circuit. At the low-band frequencies, using my arrangement, a noise figure of about 5.0 decibels was obtained, whereas the noise figure obtained with the prior-art circuit was about 7.0 to 8.5 decibels. (The 6BQ7 tube above referred to has a shield between the two triode sections, but to avoid confusion of lines the shield has been omitted from the drawing.)

It will be understood that the prior-art circuit referred to is also a grounded-cathode grounded-grid cascode amplifier. The prior-art circuit is so arranged, however, that the signal on the plate of the first triode is applied in phase to the cathode of the second triode. The signals on the plates of the two triodes are, therefore, in phase and it is necessary to employ suitable means between the plate of the second triode and the grid of the first triode to effect the required phase delay or phase shift. In some cases, the prior art employs a neutralizing inductance between the plate of the second triode and the grid of the first triode. In other cases, the neutralizing signal is fed back from a point in the second-triode plate circuit at which the signal is out of phase with the second-triode plate signal, as for example, from the low-potential end of the plate-circuit load impedance. The prior-art feed-back path frequently includes a capacitor and, in many cases at least, it is necessary to employ a capacitor of different size for high-band than for the low-band television channels. In such event, a switch is required to be provided by the prior-art arrangement.

In the arrangement proposed by the present invention, switching means are unnecessary. Thus, the cost of the half-wave transmission line is at least partially off-set.

It will be understood that while I prefer to use a half-wave transmission line, an odd multiple of one-half wavelength line may be used, if desired.

Having described my invention, I claim:

1. A high-frequency cascode amplifier adapted to amplify signals including signals lying within a band of very high frequencies, said cascode amplifier comprising: first and second electron discharge structures each having at least cathode, grid and plate electrodes; means having negligible impedance at the operating frequencies connecting the cathode of said first discharge structure to a point of fixed reference potential; means having negligible impedance at said operating frequencies connecting the grid of said second discharge structure to said point of fixed reference potential; means for applying a high-frequency signal to the grid-cathode circuit of said first discharge structure; a two-conductor transmission line coupled between the plate of said first discharge structure and the cathode of said second discharge structure, said transmission line having a length equivalent to an odd integral multiple of one-half wavelength at substantially the center frequency of said band of very high frequencies for delaying the output signal of said first discharge structure by an odd multiple of approximately 180° and for applying said delayed signal to said cathode of said second discharge structure; a path effective to feed back a signal from said second discharge structure to the grid of said first discharge structure to neutralize substantially the signal fed back to said first-discharge-structure grid from said first-discharge-structure plate; and an impedance in the plate circuit of said second discharge structure for deriving an output signal.

2. A high-frequency cascode amplifier as claimed in claim 1 characterized by the fact that said transmission line has a length equivalent substantially to one-half wavelength at the center frequency of said band of very high frequencies.

3. A high-frequency cascode amplifier as claimed in claim 2 characterized by the fact that said first and second electron discharge structures are contained in a single tube envelope, and further characterized by the fact that said path effective to feed back a signal from said second discharge structure to the grid of said first discharge structure comprises primarily the interelectrode capacitance between said second-discharge-structure plate and said first-discharge-structure grid.

4. A cascode amplifier for amplifying signals in two non-contiguous bands of high frequencies, said amplifier comprising: first and second triodes; means having negligible impedance at the operating frequencies connecting the cathode of said first triode to a point of fixed reference potential; means having negligible impedance at said operating frequencies connecting the grid of said second triode to said point of fixed reference potential; means for applying a high-frequency signal to the grid-cathode circuit of said first triode; phase-delay means comprising a two-conductor transmission line having a length approximately equal to one-half wave-length at the center frequency of the upper of said two bands of operating frequencies coupled between the plate of said first triode and the cathode of said second triode for delaying the output signal of said first triode and for applying said delayed signal to said cathode of said second triode; an inductance connected to the input circuit of said second triode for resonating out the input capacitance of said second triode at said upper-band operating frequencies; and an impedance in the plate circuit of said second triode for deriving an output signal.

5. A cascode amplifier as claimed in claim 4 characterized by the fact that both said triodes are in a common tube envelope.

6. In the tuner of a television receiver adapted to receive signals in two non-contiguous bands of high frequencies, a double-triode vacuum tube comprising a first grounded-cathode triode and second grounded-grid triode connected in cascade, said double triode including an inductance connected to the heater-circuit to resonate with the input capacitance of said second triode at the frequencies of the upper of said two bands of frequencies, the plate of said first triode being coupled to the cathode of said second triode by a two-conductor transmission line having an electrical length equivalent approximately to one-half wavelength at about the center frequency of said upper band of frequencies, said tube having such parameters that the first-triode-plate-to-first-triode-grid interelectrode capacitance is larger than the second-triode-plate-to-first-triode-grid interelectrode capacitance by a factor approximately equal to the amplification factor of said second triode.

7. In the tuner of a television receiver adapted to receive signals in two non-contiguous bands of high-frequencies, the lower of said bands extending approximately from 54 to 88 megacycles and the upper of said bands extending approximately from 174 to 216 megacycles; a double-triode vacuum tube comprising a grounded-cathode triode and grounded-grid triode connected in cascade; a two-conductor transmission line having a line length of approximately 30 inches coupling the plate of said grounded-cathode triode to the cathode of said grounded-grid triode; and an inductance connected in the heater circuit of said double triode.

ROBERT C. A. ELAND.

References Cited in the file of this patent

FOREIGN PATENTS

| Number | Country | Date |
|---|---|---|
| 559,078 | Great Britain ------- | Feb. 3, 1944 |

OTHER REFERENCES

RCA Review, March 1951, pages 18–22. Copy in 179–171–1D.

Vac. Tube Amplifiers, Valley Wallman, pp. 657–661. Pub. 1948, McGraw-Hill Book Co., Inc., New York city. (Copy in Div. 69.)